(12) United States Patent
Im et al.

(10) Patent No.: US 10,186,566 B2
(45) Date of Patent: *Jan. 22, 2019

(54) ORGANIC LIGHT EMITTING DISPLAY DEVICE AND METHOD OF MANUFACTURING THE SAME

(71) Applicant: LG Display Co., Ltd., Seoul (KR)

(72) Inventors: Jonghyeok Im, Busan (KR); Joonsuk Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/896,909

(22) Filed: Feb. 14, 2018

(65) Prior Publication Data
US 2018/0175133 A1     Jun. 21, 2018

Related U.S. Application Data

(63) Continuation of application No. 15/157,327, filed on May 17, 2016, now Pat. No. 9,929,226.

(30) Foreign Application Priority Data

Nov. 16, 2015 (KR) .................. 10-2015-0160706

(51) Int. Cl.
  H01L 27/32    (2006.01)
  H01L 51/52    (2006.01)

(52) U.S. Cl.
  CPC ...... *H01L 27/3276* (2013.01); *H01L 51/5212* (2013.01); *H01L 51/5221* (2013.01);
(Continued)

(58) Field of Classification Search
  CPC ............. H01L 27/3246; H01L 27/3276; H01L 51/5212; H01L 51/5221; H01L 51/5228
  See application file for complete search history.

(56) References Cited

U.S. PATENT DOCUMENTS 9,947,896 B2 *  4/2018  Sakamoto ........... H01L 51/5253
  2009/0315451 A1 * 12/2009  Choi ................... H01L 27/3276
                                                        313/504
(Continued)

FOREIGN PATENT DOCUMENTS

EP    3098872        11/2016
EP    3107130 A2     12/2016
(Continued)

OTHER PUBLICATIONS

Office Action for Korean Patent Application No. KR 2015-0160706, dated Oct. 18, 2017, 8 Pages. (With English Translation).
(Continued)

*Primary Examiner* — Allan R Wilson
(74) *Attorney, Agent, or Firm* — Fenwick & West LLP

(57) ABSTRACT

An organic light emitting display device is disclosed that includes a substrate including an active area and a pad area; a thin-film transistor (TFT) including a drain electrode, a source electrode, and a gate electrode; an anode electrode; an organic emitting layer; a cathode electrode; and a pad area of the substrate provided with a signal pad that is in a same layer as the drain electrode and the source electrode, the pad area including a first pad electrode on the signal pad, and a second pad electrode on the first pad electrode.

18 Claims, 6 Drawing Sheets

(52) U.S. Cl.
CPC ...... *H01L 51/5228* (2013.01); *H01L 27/3246* (2013.01); *H01L 51/5218* (2013.01); *H01L 2227/323* (2013.01)

(56) References Cited

U.S. PATENT DOCUMENTS

| | | |
|---|---|---|
| 2010/0060147 A1 | 3/2010 | Eom |
| 2012/0146060 A1 | 6/2012 | Moon et al. |
| 2013/0056784 A1 | 3/2013 | Lee et al. |
| 2014/0183479 A1 | 7/2014 | Park et al. |
| 2014/0183501 A1 | 7/2014 | Kim et al. |
| 2014/0346448 A1 | 11/2014 | You et al. |
| 2014/0353631 A1 | 12/2014 | Park et al. |
| 2015/0021564 A1* | 1/2015 | Hong ................. H01L 51/5203 257/40 |
| 2015/0108450 A1 | 4/2015 | Son et al. |
| 2016/0020422 A1 | 1/2016 | Kim et al. |
| 2016/0240598 A1 | 8/2016 | You |
| 2017/0062548 A1 | 3/2017 | Han et al. |

FOREIGN PATENT DOCUMENTS

| | | |
|---|---|---|
| KR | 20100028925 | 3/2010 |
| KR | 20120063746 | 6/2012 |
| KR | 20130025806 | 3/2013 |
| KR | 20140085979 | 7/2014 |
| KR | 20140140989 | 12/2014 |

OTHER PUBLICATIONS

Office Action for U.S. Appl. No. 15/157,327, dated Jul. 24, 2017, 10 Pages.

\* cited by examiner

ORGANIC LIGHT EMITTING DISPLAY DEVICE AND METHOD OF MANUFACTURING THE SAME

CROSS REFERENCE TO RELATED APPLICATIONS

This application is a continuation of U.S. patent application Ser. No. 15/157,327 filed on May 17, 2016 which claims the benefit of Korean Patent Application No. 10-2015-0160706 filed on Nov. 16, 2015, each of which is hereby incorporated by reference in its entirety.

BACKGROUND

Field of the Disclosure

Embodiments of the present disclosure relate to an organic light emitting display device, and more particularly, to a top emission type organic light emitting display device, and a method of manufacturing the same.

Discussion of the Related Art

An organic light emitting display (OLED) device, which is a self light emitting display device, has advantages of low power consumption, rapid response speed, high emission efficiency, high luminance and wide viewing angle.

According to a direction of light emitted from an organic light emitting device, the OLED device may be largely classified into a top emission type and a bottom emission type. In case of the bottom emission type, a circuit device is disposed between an emitting layer and an image displaying surface, whereby an aperture ratio may be lowered due to the circuit device. Meanwhile, in case of the top emission type, a circuit device is not disposed between an emitting layer and an image displaying surface, whereby an aperture ratio may be improved.

FIG. 1 is a cross sectional view of a related art top emission type OLED device.

As shown in FIG. 1, a thin film transistor layer (T) including an active layer 11, a gate insulating film 12, a gate electrode 13, an insulating interlayer 14, a source electrode 15, and a drain electrode 16 is provided on an active area (AA) of a substrate 10, and then a passivation layer 20 and a planarization layer 30 are sequentially provided on the thin film transistor layer (T).

Also, an anode electrode 40 and an auxiliary electrode 50 are provided on the planarization layer 30. The auxiliary electrode 50 is provided to lower a resistance of a cathode electrode 80 to be explained later.

On the anode electrode 40 and the auxiliary electrode 50, a bank 60 is provided to define a pixel region. Also, an organic light emitting layer 70 is provided in the pixel region defined by the bank 60, and the cathode electrode 80 is provided on the organic light emitting layer 70.

In case of the top emission type, light emitted from the organic light emitting layer 70 passes through the cathode electrode 80. For this reason, the cathode electrode 80 is formed of a transparent conductive material, which causes the increase of resistance of the cathode electrode 80. In order to lower the resistance of the cathode electrode 80, the cathode electrode 80 is connected with the auxiliary electrode 50.

On a pad area (PA) of the substrate 10, there are the gate insulating film 12 and the insulating interlayer 14. A signal pad 90 is provided on the insulating interlayer 14, and the passivation layer 20 is provided on the signal pad 90. A hole is provided in the passivation layer 20 so that the signal pad 90 is exposed to the external via the hole. In order to connect the signal pad 90 with an external driving circuit, the hole is provided in the passivation layer 20 so as to expose the signal pad 90 to the external.

However, the related art top emission type organic light emitting display device may have the following disadvantages.

In order to connect the signal pad 90 with the external driving circuit, the upper surface of the signal pad 90 is exposed to the environment. Accordingly, the upper surface of the signal pad 90 may be corroded, and furthermore the corrosion of the signal pad 90 may spread to other regions. In order to prevent the upper surface of the signal pad 90 from being corroded, a metal layer with superior corrosion resistance may be additionally provided on the upper surface of the signal pad 90. In this case, an additional process has to be carried out.

Also, in order to connect the signal pad 90 with the external driving circuit, the hole is provided in the passivation layer 20, and the upper surface of the signal pad 90 is exposed via the hole of the passivation layer 20. In this case, an etchant provided for patterning the anode electrode 40 may flow into the hole provided in the passivation layer 20, whereby the signal pad 90 may be damaged by the etchant. In order to prevent the signal pad 90 from being damaged by the etchant, a process of forming the hole for exposing the upper surface of the signal pad 90 may be carried out additionally after a process of patterning the anode electrode 40, which causes inconvenience of an additional mask process.

SUMMARY

Accordingly, embodiments of the present disclosure are directed to a top emission type organic light emitting display device that substantially obviates one or more problems due to limitations and disadvantages of the related art.

An aspect of embodiments of the present disclosure is directed to provide a top emission type organic light emitting display device which is capable of minimizing an additional process and preventing a corrosion of a signal pad, and a method of manufacturing the same.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided an organic light emitting display device comprising: a substrate including an active area that displays images and a pad area that connects to an external driving circuit; a thin-film transistor (TFT) including a drain electrode, a source electrode, and a gate electrode, the drain electrode and the source electrode in a same layer of the organic light emitting display device; an anode electrode in the active area of the substrate; an organic light emitting layer on the anode electrode; a cathode electrode on the organic light emitting layer; a signal pad on the pad area of the substrate, the signal pad in the same layer as the drain electrode and the source electrode of the TFT; a first pad electrode on the signal pad and connected with the signal pad via a contact hole, the first pad electrode comprising a same material as the anode electrode; and a second pad electrode covering the first pad electrode.

In another embodiment, an organic light emitting display device comprises: a substrate including an active area that displays images and a pad area that connects to an external driving circuit; an anode electrode in the active area of the substrate; an organic light emitting layer on the anode electrode; a cathode electrode on the organic light emitting layer; an auxiliary electrode connected with the cathode electrode, the auxiliary electrode including: a first auxiliary electrode provided in a same layer as the anode electrode and horizontally spaced apart from the anode electrode; and a second auxiliary electrode on the first auxiliary electrode, the second auxiliary electrode directly connected with the cathode electrode.

In another aspect of embodiments of the present disclosure, there is provided a method of manufacturing an organic light emitting display device that may include simultaneously providing a source electrode of a thin-film-transistor (TFT), a drain electrode of the TFT, and a signal pad on a substrate, the source electrode and the drain electrode provided in an active area of the substrate that displays images and the signal pad provided in a pad area of the substrate that connects to an external driving circuit; providing a passivation layer on the source electrode, the drain electrode, and the signal pad; simultaneously removing a first portion of the passivation layer to create a first contact hole that exposes either a portion of the source electrode or a portion of the drain electrode, and removing a second portion of the passivation layer to create a second contact hole that exposes a portion of the signal pad; simultaneously providing an anode electrode connected with the source electrode or the drain electrode, a first auxiliary electrode in a same layer as the anode electrode and horizontally spaced apart from the anode electrode, and a first pad electrode connected with the signal pad, the first electrode pad covering the exposed portion of the signal pad; simultaneously providing a second auxiliary electrode on the first auxiliary electrode and a second pad electrode on the first pad electrode, the second auxiliary electrode covering side surfaces and an upper surface of the first auxiliary electrode, and the second pad electrode covering side surfaces and an upper surface of the first pad electrode; providing an organic light emitting layer on the anode electrode; and providing a cathode electrode on the organic light emitting layer, the cathode electrode connected with the second auxiliary electrode.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the present disclosure and together with the description serve to explain the principle of embodiments of the invention. In the drawings.

DETAILED DESCRIPTION

Figure 1:
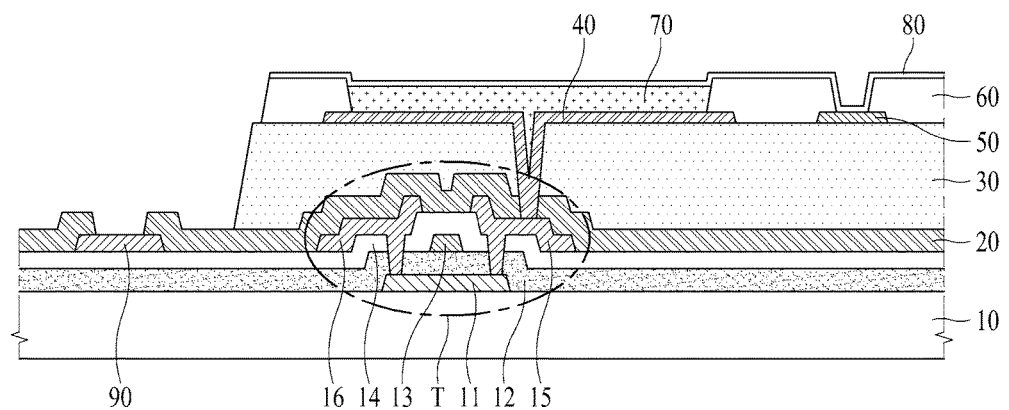
FIG. 1 is a cross sectional view illustrating a related art top emission type organic light emitting display device.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary. In construing an element, the element is construed as including an error region although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed there between.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, an organic light emitting display device according to embodiments of the present disclosure will be described in detail with reference to the accompanying drawings.

Figure 2:
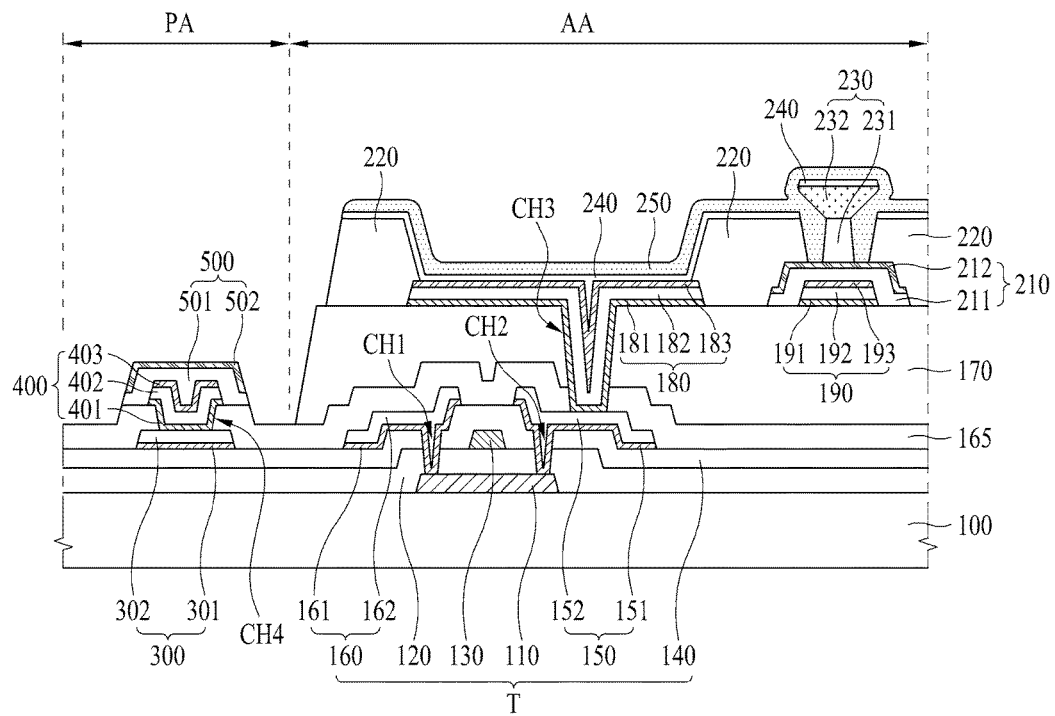
FIG. 2 is a cross sectional view illustrating an organic light emitting display device according to one embodiment of the present disclosure.

FIG. 2 is a cross sectional view illustrating an organic light emitting display device according to one embodiment of the present disclosure.

As shown in FIG. 2, the organic light emitting display device according to one embodiment of the present disclosure may include an active area (AA) that displays images and a pad area (PA) on a substrate 100.

In the active area (AA) of the substrate 100, there are a thin film transistor layer (T), a passivation layer 165, a planarization layer 170, an anode electrode 180, a first auxiliary electrode 190, a second auxiliary electrode 210, a bank 220, a partition 230, an organic light emitting layer 240 and a cathode electrode 250.

The thin film transistor layer (T) may include an active layer 110, a gate insulating film 120, a gate electrode 130, an insulating interlayer 140, a source electrode 150 and a drain electrode 160.

The active layer 110 is provided on the substrate 100, wherein the active layer 110 overlaps with the gate electrode 130. The active layer 110 may be formed a silicon-based semiconductor material or oxide-based semiconductor material. Although not shown, a light shielding layer may be additionally provided between the substrate 100 and the active layer 110. In this case, an external light, which is incident on a lower surface of the substrate 100, is blocked by the light shielding layer so that it is possible to prevent the active layer 110 from being damaged by the external light.

The gate insulating film 120 is provided on the active layer 110. The gate insulating film 120 insulates the active layer 110 and the gate electrode 130 from each other. For example, the gate insulating film 120 may be formed of an inorganic insulating material, and more particularly, the gate insulating film 120 may be formed in a single-layered structure of the inorganic insulating material such as silicon oxide SiOx or silicon nitride SiNx, or a multi-layered structure of the above silicon oxide SiOx and silicon nitride SiNx, but not limited to these structures. The gate insulating film 120 may extend to the pad area (PA).

The gate electrode 130 is provided on the gate insulating film 120. The gate electrode 130 overlaps with the active layer 110, and the gate insulating film 120 is interposed between the gate electrode 130 and the active layer 110 being overlapped with each other. The gate electrode 130 may be formed in a single-layered structure or multi-layered structure including molybdenum (Mo), aluminum (Al), chrome (Cr), aurum (Au), titanium (Ti), nickel (Ni), neodymium (Nd), copper (Cu) and their alloys, but not limited to these materials.

The insulating interlayer 140 is provided on the gate electrode 130. The insulating interlayer 140 is formed of the same material as that of the gate insulating film 120. For example, the insulating interlayer 140 may be formed in a single-layered structure of the inorganic insulating material such as silicon oxide SiOx or silicon nitride SiNx, or a multi-layered structure of the above silicon oxide SiOx and silicon nitride SiNx, but not limited to these materials and structures. The insulating interlayer 140 may extend to the pad area (PA).

The source electrode 150 and the drain electrode 160 confronting each other are provided on the insulating interlayer 140. A first contact hole (CH1) for exposing one end portion of the active layer 110 is provided in the aforementioned gate insulating film 120 and the insulating interlayer 140, and a second contact hole (CH2) for exposing the other end portion of the active layer 110 is provided in the aforementioned gate insulating film 120 and the insulating interlayer 140. The source electrode 150 is connected with the other end portion of the active layer 110 via the second contact hole (CH2), and the drain electrode 160 is connected with one end portion of the active layer 110 via the first contact hole (CH1).

The source electrode 150 may include a lower source electrode 151 and an upper source electrode 152.

The lower source electrode 151 is provided between the insulating interlayer 140 and the upper source electrode 152, wherein the lower source electrode 151 enhances an adhesive strength between the insulating interlayer 140 and the upper source electrode 152. Also, the lower source electrode 151 protects a lower surface of the upper source electrode 152 so that it is possible to prevent the lower surface of the upper source electrode 152 from being corroded. Thus, an oxidation degree of the lower source electrode 151 may be lower than an oxidation degree of the upper source electrode 152. That is, a corrosion resistance in a material of the lower source electrode 151 may be superior to a corrosion resistance in a material of the upper source electrode 152. The lower source electrode 151 functions as an adhesion enhancement layer or a corrosion preventing layer. The lower source electrode 151 may be formed of an alloy MoTi of molybdenum and titanium, but not limited to this material.

The upper source electrode 152 is provided on an upper surface of the lower source electrode 151. The upper source electrode 152 may be formed of a low-resistance metal material such as copper Cu, but not limited to this metal material. The upper source electrode 152 may be formed of a metal material whose resistance is relatively lower than that of the lower source electrode 151. In order to lower a total resistance of the source electrode 150, a thickness of the upper source electrode 152 may be larger than a thickness of the lower source electrode 151, preferably.

In the same way as the aforementioned source electrode 150, the drain electrode 160 may include a lower drain electrode 161 and an upper drain electrode 162.

The lower drain electrode 161 is provided between the insulating interlayer 140 and the upper drain electrode 162, wherein the lower drain electrode 161 enhances an adhesive strength between the insulating interlayer 140 and the upper drain electrode 162. Also, the lower drain electrode 161 prevents a lower surface of the upper drain electrode 162 from being corroded. Thus, an oxidation degree of the lower drain electrode 161 may be lower than an oxidation degree of the upper drain electrode 162. That is, a corrosion resistance in a material of the lower drain electrode 161 may be superior to a corrosion resistance in a material of the upper drain electrode 162. The lower drain electrode 161 may be formed of an alloy MoTi of molybdenum and titanium, but not limited to this material.

The upper drain electrode 162 is provided on an upper surface of the lower drain electrode 161. The upper drain electrode 162 may be formed of the same material as that of the aforementioned upper source electrode 152, for example, copper Cu, but not limited to this material. In order to lower a total resistance of the drain electrode 160, a thickness of the upper drain electrode 162 may be larger than a thickness of the lower drain electrode 161.

The upper drain electrode 162 may be formed of the same material as that of the upper source electrode 152, and the upper drain electrode 162 may be formed in the same thickness as that of the upper source electrode 152. The lower drain electrode 161 may be formed of the same material as that of the lower source electrode 151, and the lower drain electrode 161 may be formed in the same thickness as that of the lower source electrode 151. In this case, the drain electrode 160 and the source electrode 150 may be simultaneously manufactured in the same process.

A structure of the thin film transistor layer (T) is not limited to the above structure, that is, a structure of the thin film transistor layer (T) may be changed to various shapes generally known to those in the art. For example, the drawing shows a top gate structure where the gate electrode 130 is provided on the active layer 110, but not necessarily. That is, it is possible to provide a bottom gate structure where the gate electrode 130 is provided below the active layer 110.

The passivation layer 165 is provided on the thin film transistor layer (T), and more particularly, on upper surfaces of the source electrode 150 and the drain electrode 160. The passivation layer 165 protects the thin film transistor layer (T). The passivation layer 165 may be formed of an inorganic insulating material, for example, silicon oxide film SiOx or silicon nitride film SiNx, but not limited to these materials. The passivation layer 165 may extend to the pad area (PA).

The planarization layer 170 is provided on the passivation layer 165. The planarization layer 170 is provided to planarize an upper surface of the substrate 100 with the thin film transistor layer (T). The planarization layer 170 may be formed of an organic insulating material, for example, acryl resin, epoxy resin, phenolic resin, polyamide resin, polyimide resin, and etc., but not limited to these materials. The planarization layer 170 may not extend to the pad area (PA).

The anode electrode 180 and the first auxiliary electrode 190 are provided on the planarization layer 170. That is, the anode electrode 180 and the first auxiliary electrode 190 are formed in the same layer. A third contact hole (CH3) for exposing the source electrode 150 is provided in the aforementioned passivation layer 165 and the planarization layer 170. The source electrode 150 and the anode electrode 180 are connected with each other via the third contact hole (CH3). If needed, the third contact hole (CH3) provided in the passivation layer 165 and the planarization layer 170 may expose the drain electrode 160, whereby the drain electrode 160 and the anode electrode 180 may be connected with each other via the third contact hole (CH3).

The anode electrode 180 reflects a light emitted from the organic light emitting layer 240 to an upper direction. In this reason, the anode electrode 180 includes a material with good reflective properties.

The anode electrode 180 may include a lower anode electrode 181, a central anode electrode 182 and an upper anode electrode 183.

The lower anode electrode 181 is provided between the planarization layer 170 and the central anode electrode 182. The lower anode electrode 181 protects a lower surface of the central anode electrode 182 so that it is possible to prevent the lower surface of the central anode electrode 182 from being corroded. Thus, an oxidation degree of the lower anode electrode 181 may be lower than an oxidation degree of the central anode electrode 182. That is, a corrosion resistance in a material of the lower anode electrode 181 may be superior to a corrosion resistance in a material of the central anode electrode 182. Also, the lower anode electrode 181 protects an upper surface of the upper source electrode 152 so that it is possible to prevent the upper surface of the upper source electrode 152 from being corroded. Thus, an oxidation degree of the lower anode electrode 181 may be lower than an oxidation degree of the upper source electrode 152. That is, a corrosion resistance in a material of the lower anode electrode 181 may be superior to a corrosion resistance in a material of the upper source electrode 152. The lower anode electrode 181 prevents the upper surface of the upper source electrode 152 from being corroded so that it is possible to provide the aforementioned dual-layered structure in the source electrode 150.

The lower anode electrode 181 functions as a corrosion preventing layer. The lower anode electrode 181 may be formed of a transparent conductive material such as indium-tin-oxide ITO, but not limited to this material.

The central anode electrode 182 is provided between the lower anode electrode 181 and the upper anode electrode 183. The central anode electrode 182 is formed of a material with relatively-low resistance and relatively-high reflectance in comparison to the lower anode electrode 181 and the upper anode electrode 183, for example, argentums Ag, but not limited to this material. In order to lower a total resistance of the anode electrode 180, a thickness of the central anode electrode 182 with relatively-low resistance may be larger than a thickness in each of the lower anode electrode 181 and the upper anode electrode 183 with relatively-high resistance, preferably.

The upper anode electrode 183 is provided on an upper surface of the central anode electrode 182 so that it is possible to prevent an upper surface of the central anode electrode 182 from being corroded. Thus, an oxidation degree of the upper anode electrode 183 may be lower than an oxidation degree of the central anode electrode 182. That is, a corrosion resistance in a material of the upper anode electrode 183 may be superior to a corrosion resistance in a material of the central anode electrode 182. The upper anode electrode 183 may be formed of a transparent conductive material such as indium-tin-oxide ITO, but not limited to this material.

In the same way as the aforementioned anode electrode 180, the first auxiliary electrode 190 may include a first lower auxiliary electrode 191, a first central auxiliary electrode 192 and a first upper auxiliary electrode 193.

The first lower auxiliary electrode 191 is provided between the planarization layer 170 and the first central auxiliary electrode 192, wherein the first lower auxiliary electrode 191 prevents a lower surface of the first central auxiliary electrode 192 from being corroded. Thus, an oxidation degree of the first lower auxiliary electrode 191 may be lower than an oxidation degree of the first central auxiliary electrode 192. That is, a corrosion resistance in a material of the first lower auxiliary electrode 191 may be superior to a corrosion resistance in a material of the first central auxiliary electrode 192. The first lower auxiliary electrode 191 may be formed of the same material as that of the aforementioned lower anode electrode 181, that is, indium-tin-oxide ITO, but not limited to this material.

The first central auxiliary electrode 192 is provided between the first lower auxiliary electrode 191 and the first upper auxiliary electrode 193. The first central auxiliary electrode 192 may be formed of the same material as that of the aforementioned central anode electrode 182, that is, argentums Ag, but not limited to this material. In order to lower a total resistance of the first auxiliary electrode 190, a thickness of the first central auxiliary electrode 192 with a relatively low resistance may be larger than a thickness of each of the first lower auxiliary electrode 191 and the first upper auxiliary electrode 193 with a relatively high resistance, preferably.

The first upper auxiliary electrode 193 is provided on an upper surface of the first central auxiliary electrode 192. The first upper auxiliary electrode 193 prevents the upper surface of the first central auxiliary electrode 192 from being corroded. Thus, an oxidation degree of the first upper auxiliary electrode 193 may be lower than an oxidation degree of the first central auxiliary electrode 192. That is, a corrosion resistance in a material of the first upper auxiliary electrode 193 may be superior to a corrosion resistance in a material of the first central auxiliary electrode 192. The first upper auxiliary electrode 193 may be formed of the same material as that of the aforementioned upper anode electrode 183, that is, a transparent conductive material such as indium-tin-oxide ITO, but not limited to this material.

The first upper auxiliary electrode 193 may be formed of the same material as that of the upper anode electrode 183, and the first upper auxiliary electrode 193 may be formed in the same thickness as that of the upper anode electrode 183. The first central auxiliary electrode 192 may be formed of the same material as that of the central anode electrode 182, and the first central auxiliary electrode 192 may be formed in the same thickness as that of the central anode electrode 182. The first lower auxiliary electrode 191 may be formed of the same material as that of the lower anode electrode 181, and the first lower auxiliary electrode 191 may be formed in the same thickness as that of the lower anode electrode 181. In this case, the first auxiliary electrode 190 and the anode electrode 180 may be simultaneously manufactured in the same process.

The second auxiliary electrode 210 is provided on an upper surface of the first auxiliary electrode 190. In more detail, the second auxiliary electrode 210 is brought in contact with entire upper and lateral surfaces of the first auxiliary electrode 190. That is, an additional insulating layer is not provided between the first auxiliary electrode 190 and the second auxiliary electrode 210, whereby there is no need for an additional process of forming an insulating layer and a contact hole. The second auxiliary electrode 210 together with the first auxiliary electrode 190 lowers a resistance of the cathode electrode 250. In order to lower the resistance of the cathode electrode 250, the two auxiliary electrodes of the first auxiliary electrode 190 and the second auxiliary electrode 210 are deposited so that it is possible to easily control the resistance properties needed for the auxiliary electrode. In more detail, the first auxiliary electrode 190 is provided in the same layer as the anode electrode 180. If the first auxiliary electrode 190 is increased in size, the anode electrode 180 is decreased in size, to thereby lower an aperture ratio. Thus, there is a limitation on the increase of size of the first auxiliary electrode 190. According to one embodiment of the present disclosure, the second auxiliary electrode 210 is deposited on the first auxiliary electrode 190 so that it is possible to efficiently lower the resistance of the cathode electrode 250. Also, the second auxiliary electrode 210 covers the upper and lateral surfaces of the first auxiliary electrode 190 so that it is possible to prevent the upper and lateral surfaces of the first auxiliary electrode 190 from being corroded.

The second auxiliary electrode 210 may include a second lower auxiliary electrode 211 and a second upper auxiliary electrode 212.

The second lower auxiliary electrode 211 is provided between the first auxiliary electrode 190 and the second upper auxiliary electrode 212. The second lower auxiliary electrode 211 covers upper and lateral surfaces of the first auxiliary electrode 190. The second lower auxiliary electrode 211 is formed of a low-resistance material, for example, copper Cu, but not limited to this material.

The second upper auxiliary electrode 212 is provided on an upper surface of the second lower auxiliary electrode 211. The second upper auxiliary electrode 212 prevents the upper surface of the second lower auxiliary electrode 211 from being corroded. Thus, an oxidation degree of the second upper auxiliary electrode 212 may be lower than an oxidation degree of the second lower auxiliary electrode 211. That is, a corrosion resistance in a material of the second upper auxiliary electrode 212 may be superior to a corrosion resistance in a material of the second lower auxiliary electrode 211. The second upper auxiliary electrode 211 may be formed of an alloy MoTi of molybdenum and titanium, but not limited to this material. In order to lower a total resistance of the second auxiliary electrode 210, a thickness of the second lower auxiliary electrode 211 with a relatively low resistance may be larger than a thickness of the second upper auxiliary electrode 212, preferably.

The bank 220 is provided on the anode electrode 180 and the second auxiliary electrode 210.

The bank 220, which exposes the upper surface of the anode electrode 180, is provided on one side and the other side of the anode electrode 180. According as the bank 220 is provided to expose the upper surface of the anode electrode 180, it is possible to secure an image-displaying area. Also, the bank 220 is provided on one side and the other side of the anode electrode 180 so that it is possible to prevent the lateral surface of the central anode electrode 182 from being exposed to the environment, wherein the lateral surface of the central anode electrode 182 is relatively vulnerable to corrosion, thereby preventing the lateral surface of the central anode electrode 182 from being corroded.

The bank 220, which exposes the upper surface of the second auxiliary electrode 210, is provided on one side and the other side of the second auxiliary electrode 210. According as the bank 220 is provided to expose the upper surface of the second auxiliary electrode 210, it is possible to secure an electrical connection space between the second auxiliary electrode 210 and the cathode electrode 250. Also, the bank 220 is provided on one side and the other side of the second auxiliary electrode 210 so that it is possible to prevent the lateral surface of the second lower auxiliary electrode 211 from being exposed to the external, wherein the lateral surface of the second lower auxiliary electrode 211 is relatively vulnerable to corrosion, thereby preventing the lateral surface of the second lower auxiliary electrode 211 from being corroded.

Also, the bank 220 is provided between the anode electrode 180 and the second auxiliary electrode 210, to thereby insulate the anode electrode 180 and the second auxiliary electrode 210 from each other. The bank 220 may be formed of an organic insulating material, for example, polyimide resin, acryl resin, benzocyclobutene BCB, and etc., but not limited to these materials.

The partition 230 is provided on the second auxiliary electrode 210. The partition 230 is provided at a predetermined interval from the bank 220, and the second auxiliary electrode 210 and the cathode electrode 250 are electrically connected with each other through the space between the partition 230 and the bank 220. The second auxiliary electrode 210 and the cathode electrode 250 may be electrically connected with each other without forming the partition 230. However, if forming the partition 230, it facilitates a deposition process of the organic light emitting layer 240. This will be described in detail as follows.

In case the partition 230 is not formed, it is necessary to provide a mask pattern for covering the upper surface of the second auxiliary electrode 210 when the organic light emitting layer 240 is deposited to prevent the upper surface of the second auxiliary electrode 210 from being covered. However, if forming the partition 230, an upper surface of the partition 230 serves as eaves for the deposition process of the organic light emitting layer 240. Thus, the organic light emitting layer 240 is not deposited in an area below the eaves so that there is no need to provide the mask pattern for covering the upper surface of the second auxiliary electrode 210. From a front view, if the upper surface of the partition 230 serving as the eaves is configured to cover the space between the partition 230 and the bank 220, it is possible to prevent the organic light emitting layer 240 from being permeated into the space between the partition 230 and the bank 220. Thus, the second auxiliary electrode 210 may be exposed in the space between the partition 230 and the bank 220. Especially, the organic light emitting layer 240 may be manufactured by an evaporation method using a deposition material with superior straightness. Thus, the organic light emitting layer 240 is not deposited in the space between the partition 230 and the bank 220 for the deposition process of the organic light emitting layer 240.

As described above, in order to provide the partition 230 whose upper surface serves as the eaves, a width in the upper surface of the partition 230 is larger than a width in the lower surface of the partition 230. The partition 230 may include a first partition 231 and a second partition 232. The first partition 231 is provided on the upper surface of the second auxiliary electrode 210. The first partition 231 may be formed of the same material as that of the bank 220, and the first partition 231 and the bank 220 may be manufactured in the same process. The second partition 232 is provided on an upper surface of the first partition 231. A width in the upper surface of the second partition 232 is larger than a width in the lower surface of the second partition 232. Especially, the upper surface of the second partition 232 is configured to cover the space between the partition 230 and the bank 220, whereby the partition 230 serves as the eaves.

The organic light emitting layer 240 is provided on the anode electrode 180. The organic light emitting layer 240 may include a hole injecting layer, a hole transporting layer, an emitting layer, an electron transporting layer and an electron injecting layer. A structure of the organic light emitting layer 240 may be changed to various shapes generally known to those in the art.

The organic light emitting layer 240 may extend to the upper surface of the bank 220. However, when the organic light emitting layer 240 extends to the upper surface of the bank 220, the upper surface of the second auxiliary electrode 210 is not covered by the organic light emitting layer 240. If the upper surface of the second auxiliary electrode 210 is covered by the organic light emitting layer 240, it is difficult to electrically connect the second auxiliary electrode 210 and the cathode electrode 250 with each other. As described above, the organic light emitting layer 240 may be manufactured for the deposition process without using the mask for covering the upper surface of the second auxiliary electrode 210. In this case, the organic light emitting layer 240 may be provided on the upper surface of the partition 230.

The cathode electrode 250 is provided on the organic light emitting layer 240. As the cathode electrode 250 is provided on a surface from which light is emitted, the cathode electrode 250 is formed of a transparent conductive material. Thus, a resistance of the cathode electrode 250 is increased since the cathode electrode 250 is formed of the transparent conductive material. In order to lower the resistance of the cathode electrode 250, the cathode electrode 250 is connected with the second auxiliary electrode 210. That is, the cathode electrode 250 is connected with the second auxiliary electrode 210 via the space between the partition 230 and the bank 220. The cathode electrode 250 may be manufactured by sputtering, that is, a deposition process using a deposition material with inferior straightness. Accordingly, the cathode electrode 250 may be deposited in the space between the partition 230 and the bank 220 for the deposition process of the cathode electrode 250.

Although not shown, an encapsulation layer for preventing a permeation of moisture may be additionally provided on the cathode electrode 250. The encapsulation layer may be formed of various materials generally known to those in the art. Although not shown, a color filter for each pixel may be additionally provided on the cathode electrode 250. In this case, a white light may be emitted from the organic light emitting layer 240

In the pad area (PA) of the substrate 100, there are a gate insulating film 120, an insulating interlayer 140, a signal pad 300, a passivation layer 165, a first pad electrode 400 and a second pad electrode 500.

The gate insulating film 120 is provided on the substrate 100, and the insulating interlayer 140 is provided on the gate insulating film 120. The gate insulating film 120 and the insulating interlayer 140, which extend from the active area (AA), are formed on an entire surface of the pad area (PA).

The signal pad 300 is provided on the insulating interlayer 140. The signal pad 300 may be formed of the same material as that of the source electrode 150 and the drain electrode 160 of the aforementioned active area (AA).

The signal pad 300 may include a lower signal pad 301 and an upper signal pad 302.

The lower signal pad 301 is provided between the insulating interlayer 140 and the upper signal pad 302, wherein the lower signal pad 301 enhances an adhesive strength between the insulating interlayer 140 and the upper signal pad 302. Also, the lower signal pad 301 prevents a lower surface of the upper signal pad 302 from being corroded. Thus, an oxidation degree of the lower signal pad 301 may be lower than an oxidation degree of the upper signal pad 302. That is, a corrosion resistance in a material of the lower signal pad 301 may be superior to a corrosion resistance in a material of the upper signal pad 302. The lower signal pad 301 may be formed of the same material as that of the aforementioned lower source electrode 151 or lower drain electrode 161, that is, an alloy MoTi of molybdenum and titanium, but not limited to this material.

The upper signal pad 302 is provided on an upper surface of the lower signal pad 301. The upper signal pad 302 may be formed of a low-resistance metal material such as copper Cu, but not limited to this metal material. The upper signal pad 302 may be formed of a metal material whose resistance is relatively lower than that of the lower signal pad 301. In order to lower a total resistance of the signal pad 300, a thickness of the upper signal pad 302 may be larger than a thickness of the lower signal pad 301, preferably.

The upper signal pad 302 may be formed of the same material as that of the upper source electrode 152 and/or upper drain electrode 162, and may be formed in the same thickness as the upper source electrode 152 and/or upper drain electrode 162. The lower signal pad 301 may be formed of the same material as that of the lower source electrode 151 and/or lower drain electrode 161, and may be formed in the same thickness as the lower source electrode 151 and/or lower drain electrode 161. In this case, the signal pad 300 and the source electrode 150 and/or drain electrode 160 may be simultaneously manufactured in the same process.

The passivation layer 165 is provided on the signal pad 300. The passivation layer 165 extends from the active area (AA). A fourth contact hole (CH4) for exposing a predetermined part of the signal pad 300 is provided in the passivation layer 165.

The first pad electrode 400 is provided on the passivation layer 165. The first pad electrode 400 is connected with the signal pad 300 via the fourth contact hole (CH4).

The first pad electrode 400 protects an upper surface of the signal pad 300. The upper surface of the signal pad 300 is formed of the upper signal pad 302 which is relatively vulnerable to corrosion. In this reason, the first pad electrode 400 is provided to cover the upper surface of the upper signal pad 302 which is exposed via the fourth contact hole (CH4), thereby preventing the upper signal pad 302 from being corroded. The first pad electrode 400 prevents the upper surface of the upper signal pad 302 from being corroded. Thus, it is possible to provide the aforementioned dual-layered structure in the signal pad 300.

In the same way as the aforementioned anode electrode 180 and the first auxiliary electrode 190, the first pad electrode 400 may include a first lower pad electrode 401, a first central pad electrode 402 and a first upper pad electrode 403.

The first lower pad electrode 401 is provided between the upper signal pad 302 and the first central pad electrode 402. The first lower pad electrode 401 prevents an upper surface of the upper signal pad 302 and a lower surface of the first central pad electrode 402 from being corroded. Thus, an oxidation degree of the first lower pad electrode 401 may be lower than an oxidation degree of each of the upper signal pad 302 and the first central pad electrode 402. That is, a corrosion resistance in a material of the first lower pad electrode 401 may be superior to a corrosion resistance in a material of each of the upper signal pad 302 and the first central pad electrode 402. The first lower pad electrode 401 may be formed of the same material as that of the lower anode electrode 181 and the first lower auxiliary electrode 191, that is, a transparent conductive material such as indium-tin-oxide ITO, but not limited to this material.

The first central pad electrode 402 is provided between the first lower pad electrode 401 and the first upper pad electrode 403. The first central pad electrode 402 may be formed of the same material as that of the central anode electrode 182 and the first central auxiliary electrode 192, that is, argentums Ag, but not limited to this material. In order to lower a total resistance of the first pad electrode 400, a thickness of the first central pad electrode 402 with a relatively low resistance may be larger than a thickness of each of the first lower pad electrode 401 and the first upper pad electrode 403 with a relatively high resistance, preferably.

The first upper pad electrode 403 is provided on an upper surface of the first central pad electrode 402 so that it is possible to prevent the upper surface of the first central pad electrode 402 from being corroded. Thus, an oxidation degree of the first upper pad electrode 403 may be lower than an oxidation degree of the first central pad electrode 402. That is, a corrosion resistance in a material of the first upper pad electrode 403 may be superior to a corrosion resistance in a material of the first central pad electrode 402.

The first upper pad electrode 403 may be formed of the same material as that of the upper anode electrode 183 and the first upper auxiliary electrode 193, that is, a transparent conductive material such as indium-tin-oxide ITO, but not limited to this material.

The first upper pad electrode 403 may be formed of the same material as that of each of the upper anode electrode 183 and the first upper auxiliary electrode 193, and may be formed in the same thickness as that of each of the upper anode electrode 183 and the first upper auxiliary electrode 193. The first central pad electrode 402 may be formed of the same material as that of each of the central anode electrode 182 and the first central auxiliary electrode 192, and may be formed in the same thickness as that of each of the central anode electrode 182 and the first central auxiliary electrode 192. The first lower pad electrode 401 may be formed of the same material as that of each of the lower anode electrode 181 and the first lower auxiliary electrode 191, and may be formed in the same thickness as that of each of the lower anode electrode 181 and the first lower auxiliary electrode 191. In this case, the first pad electrode 400, the anode electrode 180 and the first auxiliary electrode 190 may be simultaneously manufactured in the same process.

The second pad electrode 500 is provided on an upper surface of the first pad electrode 400. In more detail, the second pad electrode 500 is brought in contact with entire upper and lateral surfaces of the first pad electrode 400. That is, an additional insulating layer is not provided between the second pad electrode 500 and the first pad electrode 400, whereby there is no need for an additional process of forming an insulating layer and a contact hole. The second pad electrode 500 covers upper and lateral surfaces of the first pad electrode 400, to thereby prevent a corrosion of the first pad electrode 400.

The second pad electrode 500 may include a second lower pad electrode 501 and a second upper pad electrode 502.

The second lower pad electrode 501 is provided between the first pad electrode 300 and the second upper pad electrode 502. The second lower pad electrode 501 covers upper and lateral surfaces of the first pad electrode 300. The second lower pad electrode 501 may be formed of a low-resistance material, for example, copper Cu, but not limited to this material.

The second upper pad electrode 502 is provided on an upper surface of the second lower pad electrode 501. The second upper pad electrode 502 is exposed to the environment, and is connected with an external driver. Since the second upper pad electrode 502 is exposed to the environment, the second upper pad electrode 502 is formed of a material with a superior corrosion resistance, in one embodiment. The second upper pad electrode 502 prevents the upper surface of the second lower pad electrode 501 from being corroded. Thus, an oxidation degree of the second upper pad electrode 502 may be lower than an oxidation degree of the second lower pad electrode 501. That is, a corrosion resistance in a material of the second upper pad electrode 502 may be superior to a corrosion resistance in a material of the second lower pad electrode 501. The second upper pad electrode 502 may be formed of an alloy MoTi of molybdenum and titanium, but not limited to this material.

In order to lower a total resistance of the second pad electrode 500, a thickness of the second lower pad electrode 501 with a relatively-low resistance may be larger than a thickness of the second upper pad electrode 502 with a relatively-high resistance, preferably.

The second upper pad electrode 502 may be formed of the same material as that of the second upper auxiliary electrode 212, and may be formed in the same thickness as that of the second upper auxiliary electrode 212. The second lower pad electrode 501 may be formed of the same material as that of the second lower auxiliary electrode 211, and may be formed in the same thickness as that of the second lower auxiliary electrode 211. In this case, the second pad electrode 500 and the second auxiliary electrode 210 may be simultaneously manufactured in the same process.

FIGS. 3A to 3H are cross sectional views illustrating a method of manufacturing the organic light emitting display device according to one embodiment of the present disclosure, which relate to the organic light emitting display device shown in FIG. 2. Thus, the same reference numbers will be used throughout the drawings to refer to the same or like parts, and a detailed description for the same parts will be omitted.

Figure 3A:
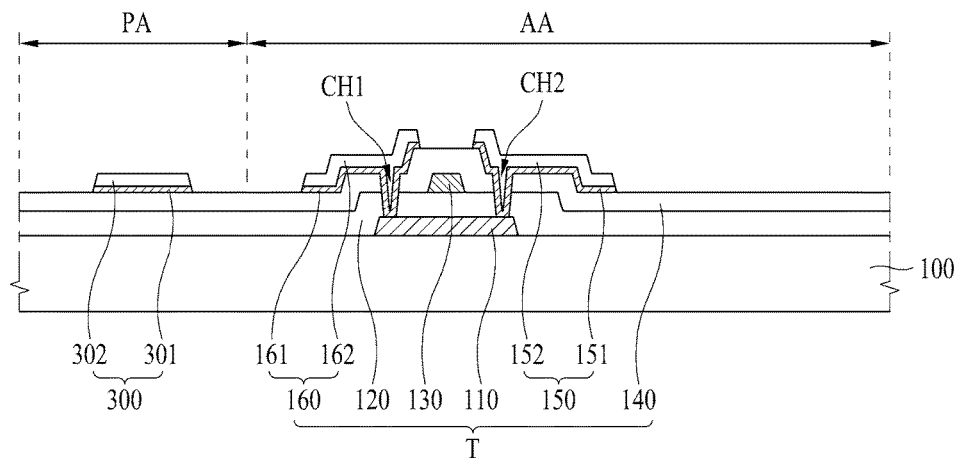
FIGS. 3A to 3H are cross sectional views illustrating a method of manufacturing the organic light emitting display device according to one embodiment of the present disclosure.

First, as shown in FIG. 3A, the active layer 110, the gate insulating film 120, the gate electrode 130, the insulating interlayer 140, the source electrode 150, the drain electrode 160 and the signal pad 300 are sequentially provided on the substrate 100.

In more detail, the active layer 110 is provided on the substrate 100, the gate insulating film 120 is provided on the active layer 110, the gate electrode 130 is provided on the gate insulating film 120, the insulating interlayer 140 is provided on the gate electrode 130, the first and second contact holes (CH1, CH2) are provided in the gate insulating film 120 and the insulating interlayer 140, the drain electrode 160 connected with one end portion of the active layer 110 via the first contact hole (CH1) is provided, the source electrode 150 connected with the other end portion of the active layer 110 via the second contact hole (CH2) is provided, and the signal pad 300 is provided.

In this case, the active layer 110, the gate electrode 130, the source electrode 150 and the drain electrode 160 are provided in the active area (AA), the gate insulating film 120 and the insulating interlayer 140 extend from the active area (AA) to the pad area (PA), and the signal pad 330 is provided in the pad area (PA). By the aforementioned manufacturing process, the thin film transistor layer (T) is formed in the active area (AA), and the signal pad 300 is formed in the pad area (PA).

The source electrode 150 may include the lower source electrode 151 and the upper source electrode 152. The drain electrode 160 may include the lower drain electrode 161 and the upper drain electrode 162. The signal pad 300 may include the lower signal pad 301 and the upper signal pad 302. The source electrode 150, the drain electrode 160 and the signal pad 300 may be formed of the same material, and may be simultaneously manufactured in the same patterning process.

Figure 3B:
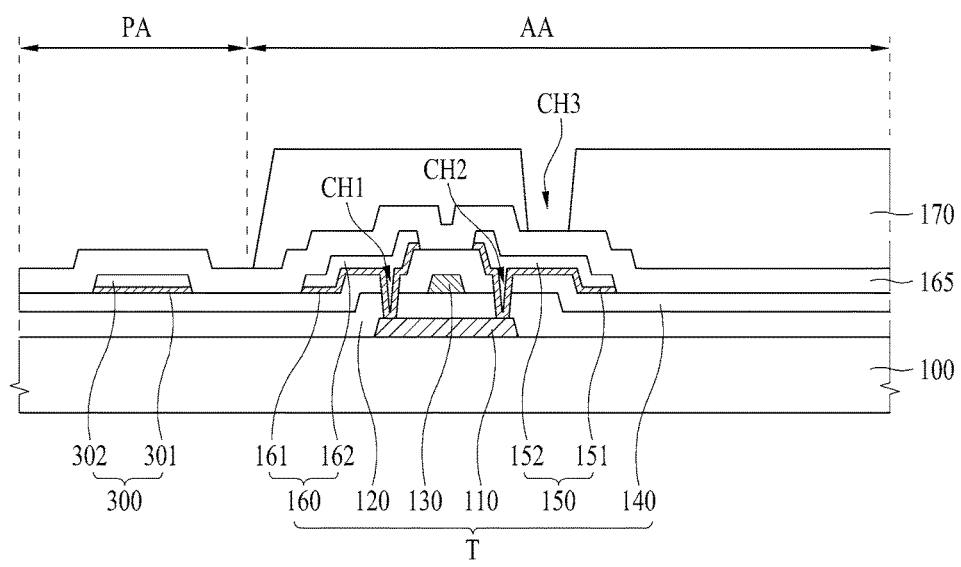

Then, as shown in FIG. 3B, the passivation layer 165 is provided on the source electrode 150, the drain electrode 160 and the signal pad 300. The planarization layer 170 is provided on the passivation layer 165. The planarization layer 170 is provided to include the third contact hole (CH3).

The passivation layer 165 extends from the active area (AA) to the pad area (PA), and the planarization layer 170 is provided in the active area (AA). The thin film transistor is not formed in the pad area (PA), that is, it is unnecessary to planarize the surface of the pad area (PA). Accordingly, the planarization layer 170 is not provided in the pad area (PA).

Figure 3C:
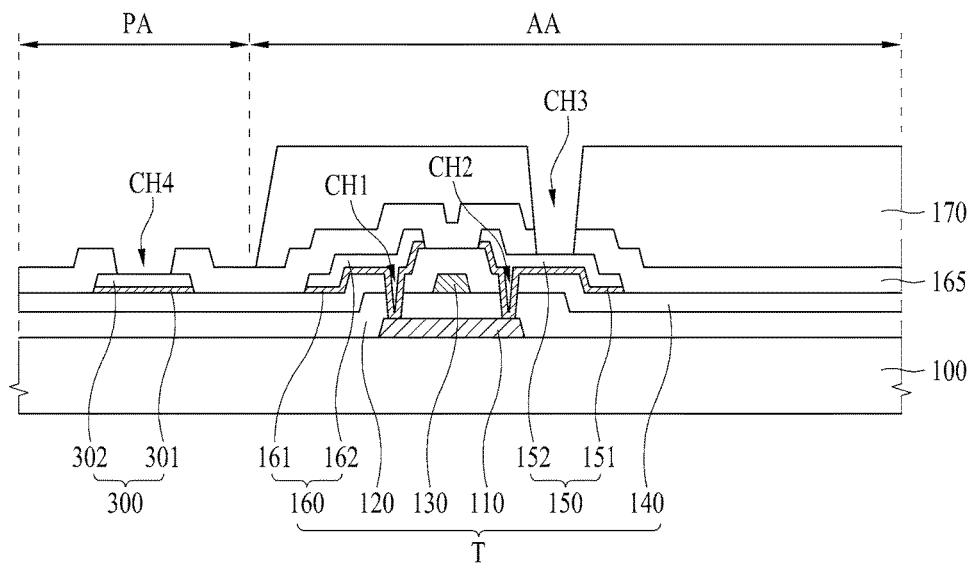

Then, as shown in FIG. 3C, the third contact hole (CH3) and the fourth contact hole (CH4) are provided in the passivation layer 165 by removing the predetermined portions of the passivation layer 165. The source electrode 150 is exposed to the external via the third contact hole (CH3) provided in the passivation layer 165 and the planarization layer 170, and the signal pad 300 is exposed to the external via the fourth contact hole (CH4) provided in the passivation layer 165. Meanwhile, the drain electrode 160 may be exposed to the external via the third contact hole (CH3).

According to one embodiment of the present disclosure, it is possible to form the third contact hole (CH3) for exposing the source electrode 150 to the external and the fourth contact hole (CH4) for exposing the signal pad 300 to the external in the passivation layer 165 at the same time. Accordingly, the third contact hole (CH3) and the fourth contact hole (CH4) may be formed by one mask process, that is, it is possible to prevent the increase of mask processes. This will be described in detail. The upper signal pad 302 exposed via the fourth contact hole (CH4) is vulnerable to corrosion. Thus, it is necessary to prevent the upper signal pad 302 from being in contact with the etchant. According to one embodiment of the present disclosure, the exposed upper signal pad 302 is covered with the first pad electrode 400 by the following process of FIG. 3D, whereby there is no worry about the contact between the upper signal pad 302 and the etchant. Thus, the third contact hole (CH3) and the fourth contact hole (CH4) may be manufactured at the same time.

Figure 3D:
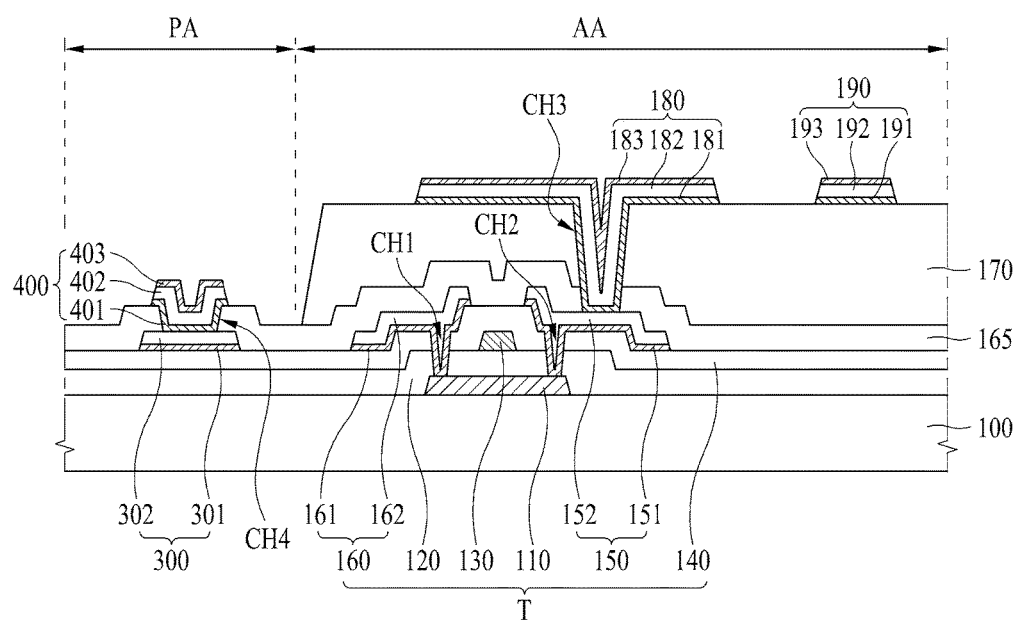

Then, as shown in FIG. 3D, the anode electrode 180 and the first auxiliary electrode 190 are provided on the planarization layer 170 of the active area (AA), wherein the anode electrode 180 and the first auxiliary electrode 190 are spaced apart from each other. The first pad electrode 400 is provided on the passivation layer 165 of the pad area (PA).

The anode electrode 180 is connected with the source electrode 150 or drain electrode 160 via the third contact hole (CH3), and the first pad electrode 400 is connected with the signal pad 300 via the fourth contact hole (CH4).

The anode electrode 180 may include the lower anode electrode 181, the central anode electrode 182 and the upper anode electrode 183. The first auxiliary electrode 190 may include the first lower auxiliary electrode 191, the first central auxiliary electrode 192 and the first upper auxiliary electrode 193. The first pad electrode 400 may include the first lower pad electrode 401, the first central pad electrode 402 and the first upper pad electrode 403.

The anode electrode 180, the first auxiliary electrode 190 and the first pad electrode 400 may be formed of the same material, and may be simultaneously manufactured in the same patterning process.

Figure 3E:
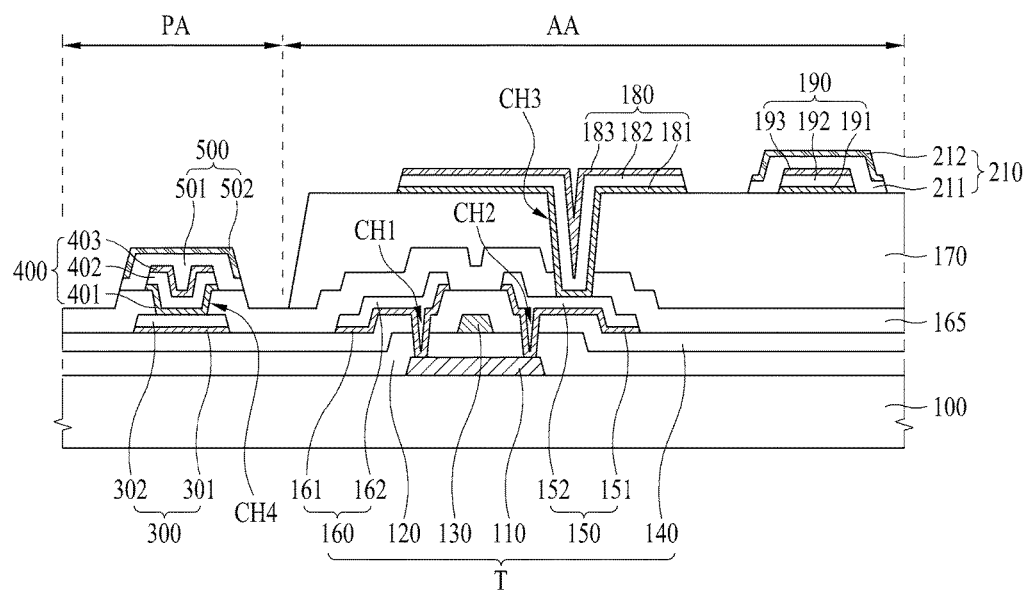

Then, as shown in FIG. 3E, the second auxiliary electrode 210 is provided on the first auxiliary electrode 190 of the active area (AA), and the second pad electrode 500 is provided on the first pad electrode 400 of the pad area (PA).

The second auxiliary electrode 210 is patterned to cover upper and lateral surfaces of the first auxiliary electrode 190, and the second pad electrode 500 is patterned to cover upper and lateral surfaces of the first pad electrode 400.

The second pad electrode 500 and the second auxiliary electrode 210 may be formed of the same material, and may be simultaneously manufactured in the same patterning process.

The second auxiliary electrode 210 may include the second lower auxiliary electrode 211 and the second upper auxiliary electrode 212, and the second pad electrode 500 may include the second lower pad electrode 501 and the second upper pad electrode 502.

Figure 3F:
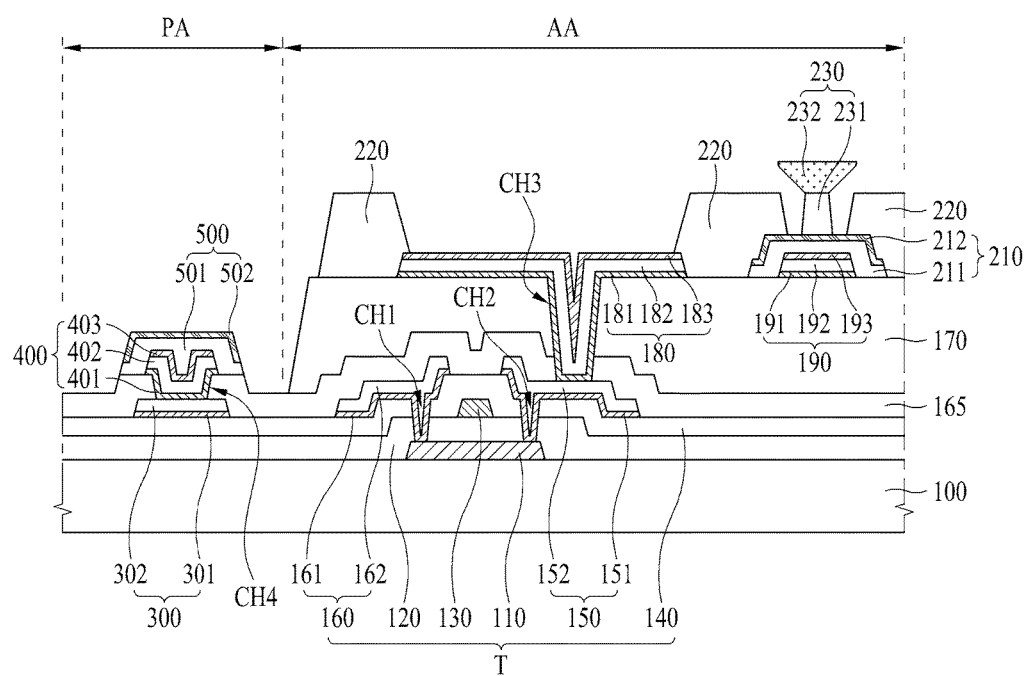

As shown in FIG. 3F, the bank 220, which exposes the upper surface of the anode electrode 180, is provided on one side and the other side of the anode electrode 80. Also, the bank 220, which exposes the upper surface of the second auxiliary electrode 210, is provided on one side and the other side of the second auxiliary electrode 210.

The first partition 231 and the second partition 232 are sequentially provided on the upper surface of the exposed second auxiliary electrode 210. The first partition 231 and the bank 220 may be formed of the same material, and may be simultaneously manufactured in the same patterning process. The partition 230 is spaced apart from the bank 220, whereby the space is prepared between the partition 230 and the bank 220.

In order to provide the partition 230 whose upper surface serves as the eaves, the width in the upper surface of the partition 230 is larger than the width in the lower surface of the partition 230. Especially, from a front view, the space between the partition 230 and the bank 220 is covered by the upper surface of the second partition 232 so that it is possible to prevent the organic light emitting layer 240 from being deposited in the space between the partition 230 and the bank 220 for the deposition process of the organic light emitting layer 240.

Figure 3G:
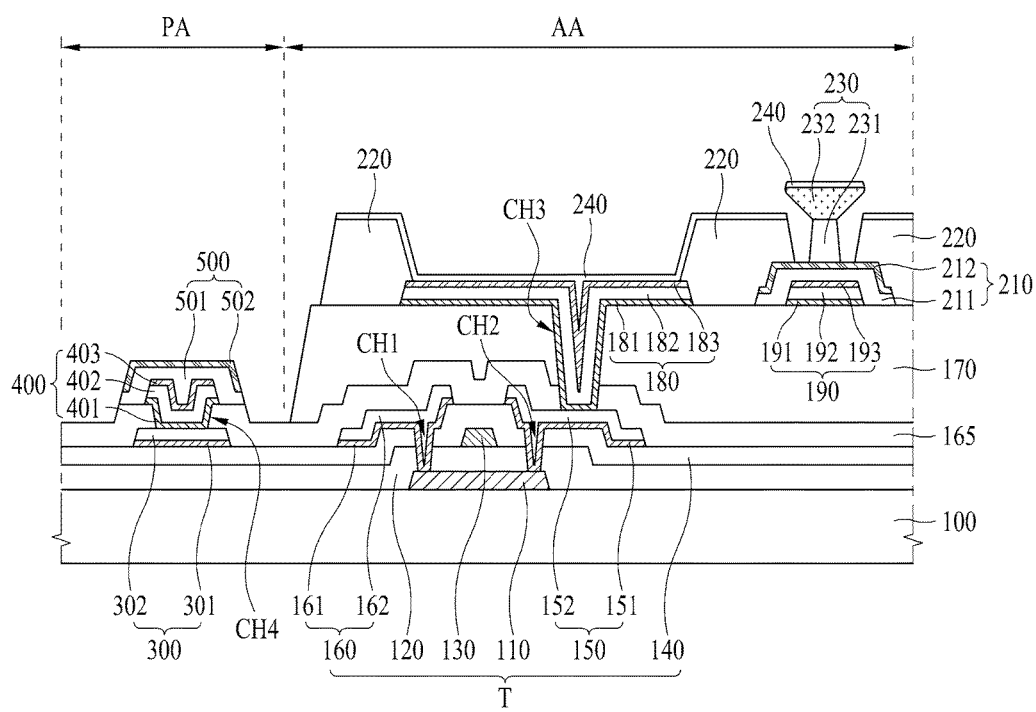

As shown in FIG. 3G, the organic light emitting layer 240 is provided on the anode electrode 180. The organic light emitting layer 240 may be manufactured by an evaporation method using a deposition material with superior straightness. Thus, the organic light emitting layer 240 is deposited on the upper surface of the bank 220 and the partition 230, however, the organic light emitting layer 240 is not deposited in the space between the bank 220 and the partition 230. That is, the upper surface of the partition 230 serves as the eaves for the deposition process of the organic light emitting layer 240, whereby it is possible to prevent the organic light emitting layer 240 from being deposited in the space between the partition 230 and the bank 220 for the deposition process of the organic light emitting layer 240 without using the mask pattern of covering the upper surface of the second auxiliary electrode 210.

Figure 3H:
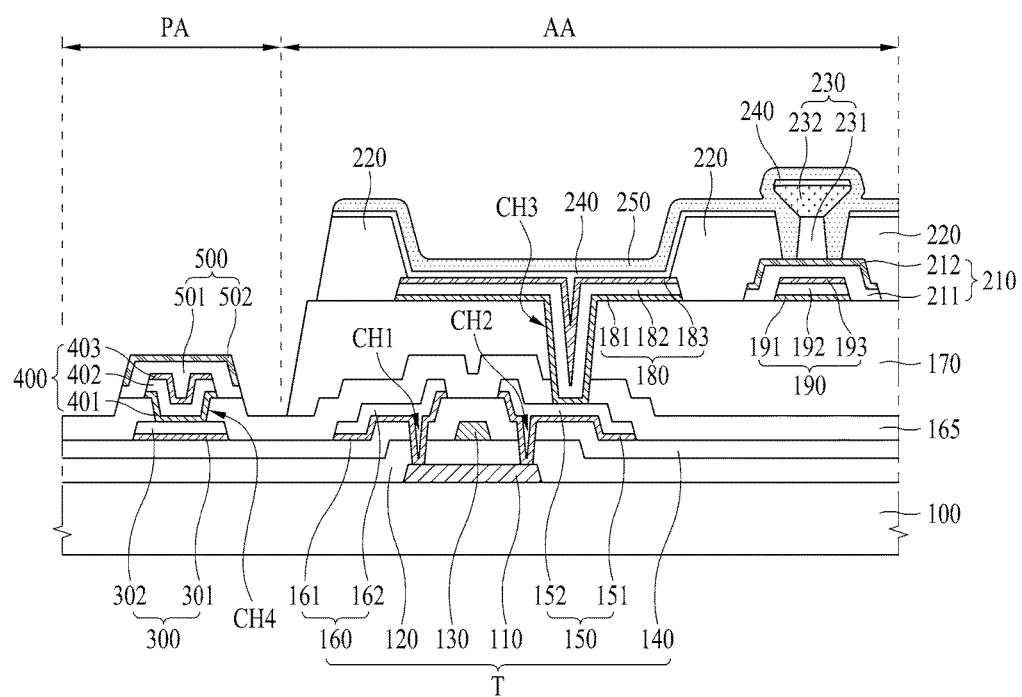

As shown in FIG. 3H, the cathode electrode 250 is provided on the organic light emitting layer 240.

The cathode electrode 250 is connected with the second auxiliary electrode 210 via the space between the partition 230 and the bank 220. The cathode electrode 250 may be manufactured by sputtering, that is, a deposition process using a deposition material with inferior straightness. Accordingly, the cathode electrode 250 may be deposited in the space between the partition 230 and the bank 220 for the deposition process of the cathode electrode 250.

According to the present disclosure, the pad electrode covers the upper surface of the signal pad so that it is possible to prevent the corrosion of the signal pad. Thus, the signal pad is formed in the dual-layered structure including the lower signal pad and the upper signal pad which is vulnerable to corrosion.

Also, the contact hole for exposing the source electrode or drain electrode to the external and the contact hole for exposing the signal pad to the external are formed at the same time in the passivation layer so that it is possible to prevent the increase of mask process.

Furthermore, the anode electrode, the first auxiliary electrode and the first pad electrode are formed at the same time, and the second auxiliary electrode and the second pad electrode are formed at the same time, thereby preventing the increase of mask process.

In order to lower the resistance of the cathode electrode, the two auxiliary electrodes of the first auxiliary electrode and the second auxiliary electrode are deposited so that it is possible to easily control the resistance properties needed for the auxiliary electrode.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting display device comprising:
   a substrate including an active area and a pad area;
   a thin-film transistor (TFT) including a drain electrode, a source electrode, and a gate electrode;
   a first electrode in the active area;
   a light emitting layer on the first electrode;
   a second electrode on the light emitting layer;
   a signal pad electrode in the pad area, the signal pad electrode comprising a same material as the drain electrode or the source electrode;
   a first pad electrode on the signal pad electrode in the pad area and electrically connected with the signal pad electrode, the first pad electrode comprising a same material as the first electrode; and
   a second pad electrode covering the first pad electrode in the pad area, the second pad electrode not extending into the active area of the substrate.

2. The light emitting display device of claim 1, further comprising:
   an auxiliary electrode connected with the second electrode, the auxiliary electrode including:
      a first auxiliary electrode comprising the same material as the first electrode; and
      a second auxiliary electrode on the first auxiliary electrode.

3. The light emitting display device of claim 2, wherein the first auxiliary electrode is horizontally spaced apart from the first electrode.

4. The light emitting display device according to claim 2, wherein the second auxiliary electrode covers side surfaces and an upper surface of the first auxiliary electrode, and the second pad electrode covers an upper surface and side surfaces of the first pad electrode.

5. The light emitting display device according to claim 2, wherein the second auxiliary electrode and the second pad electrode comprises a same material.

6. The light emitting display device according to claim 2, wherein the first auxiliary electrode includes a first auxiliary electrode portion, a second auxiliary electrode portion on the first auxiliary electrode portion, and a third auxiliary electrode portion on the second auxiliary electrode portion, and the second auxiliary electrode includes a first auxiliary electrode portion and a second auxiliary electrode portion on the first auxiliary portion of the second auxiliary electrode,
   wherein the first auxiliary electrode portion of the second auxiliary electrode covers side surfaces and an upper surface of the first auxiliary electrode.

7. The light emitting display device according to claim 6, wherein the first auxiliary electrode portion and the third auxiliary electrode portion of the first auxiliary electrode have a higher resistance to corrosion than the second auxiliary electrode portion of the first auxiliary electrode, and wherein a thickness of the second auxiliary electrode portion of the first auxiliary electrode is greater than thicknesses of the first auxiliary electrode portion and the third auxiliary electrode portion of the first auxiliary electrode; and wherein the second auxiliary electrode portion of the second auxiliary electrode has a higher resistance to corrosion than the first auxiliary electrode portion of the second auxiliary electrode, and wherein a thickness of the first auxiliary electrode portion of the second auxiliary electrode is greater than a thickness of the second auxiliary electrode portion of the second auxiliary electrode.

8. The light emitting display device according to claim 1, wherein the signal pad electrode further comprises:
  a first signal pad electrode; and
  a second signal pad electrode on the first signal pad electrode;
  wherein the first signal pad electrode has a higher resistance to corrosion than the second signal pad electrode, and wherein a thickness of the second signal pad electrode is greater than a thickness of the first signal pad electrode.

9. The light emitting display device according to claim 2, wherein the second auxiliary electrode includes a first end and a second end that is opposite the first end, and the light emitting display device further comprising:
  a first bank over the first end of the second auxiliary electrode;
  a second bank over the second end of the second auxiliary electrode; and
  a partition on the second auxiliary electrode and positioned between the first bank and the second bank;
  wherein the second electrode is connected with the second auxiliary electrode via a first space between the first bank and the partition and a second space between the second bank and the partition.

10. The light emitting display device according to claim 2, wherein the second auxiliary electrode is directly connected with the second electrode.

11. The light emitting display device according to claim 1, wherein the first pad electrode comprises:
  a first pad electrode portion;
  a second pad electrode portion on the first pad electrode portion; and
  a third pad electrode portion on the second pad electrode portion;
  wherein the first pad electrode portion and the third pad electrode portion have a higher resistance to corrosion than the second pad electrode portion, and wherein a thickness of the second pad electrode portion is greater than thicknesses of the first pad electrode portion and the third pad electrode portion.

12. The light emitting display device according to claim 11, wherein the second pad electrode comprises:
  a first pad electrode portion over side surfaces and an upper surface of the first pad electrode; and
  a second pad electrode portion on the first pad electrode portion of the second pad electrode;
  wherein the second pad electrode portion of the second pad electrode has a higher resistance to corrosion than the first pad electrode portion of the second pad electrode, and wherein a thickness of the first pad electrode portion of the second pad electrode is greater than a thickness of the second pad electrode portion of the second pad electrode.

13. A light emitting display device comprising:
  a substrate including an active area and a pad area;
  a first bank and a second bank in the active area;
  a first electrode in the active area;
  an light emitting layer on the first electrode;
  a second electrode on the light emitting layer;
  an auxiliary electrode electrically connected with the second electrode and provided in the active area, the auxiliary electrode including:
  a first auxiliary electrode including a first material and spaced apart from the first electrode; and
  a second auxiliary electrode on the first auxiliary electrode, the second auxiliary electrode directly connected with the second electrode extending over the second auxiliary electrode,
  wherein the auxiliary electrode is provided in a space between the first bank and the second bank, and
  wherein the light emitting layer extends to an upper surface of the first bank.

14. The light emitting display device according to claim 13, wherein the second auxiliary electrode covers side surfaces and an upper surface of the first auxiliary electrode.

15. The light emitting display device according to claim 13, wherein the first auxiliary electrode includes a first auxiliary electrode portion, a second auxiliary electrode portion on the first auxiliary electrode portion, and a third auxiliary electrode portion on the second auxiliary electrode portion, and the second auxiliary electrode includes a first auxiliary electrode portion and a second auxiliary electrode portion on the first auxiliary portion of the second auxiliary electrode,
  wherein the first auxiliary electrode portion of the second auxiliary electrode covers side surfaces and an upper surface of the first auxiliary electrode.

16. The light emitting display device according to claim 15,
  wherein the first auxiliary electrode portion and the third auxiliary electrode portion of the first auxiliary electrode have a higher resistance to corrosion than the second auxiliary electrode portion of the first auxiliary electrode, and wherein a thickness of the second auxiliary electrode portion of the first auxiliary electrode is greater than thicknesses of the first auxiliary electrode portion and the third auxiliary electrode portion of the first auxiliary electrode; and
  wherein the second auxiliary electrode portion of the second auxiliary electrode has a higher resistance to corrosion than the first auxiliary electrode portion of the second auxiliary electrode, and wherein a thickness of the first auxiliary electrode portion of the second auxiliary electrode is greater than a thickness of the second auxiliary electrode portion of the second auxiliary electrode.

17. The light emitting display device according to claim 13, further comprising:
  a partition on the second auxiliary electrode and positioned between the first bank and the second bank,
  wherein the second electrode is connected with the second auxiliary electrode via a first space between the first bank and the partition and a second space between the second bank and the partition.

18. The light emitting display device according to claim 13,
  wherein the second auxiliary electrode includes a first end and a second end that is opposite the first end, and
  wherein the first bank is over the first end of the second auxiliary electrode and the second bank is over the second end of the second auxiliary electrode.

* * * * *